(12) United States Patent
Ko et al.

(10) Patent No.: US 7,745,904 B2
(45) Date of Patent: Jun. 29, 2010

(54) SHALLOW TRENCH ISOLATION STRUCTURE FOR SEMICONDUCTOR DEVICE

(75) Inventors: Chih-Hsin Ko, Fongshan (TW); Chung-Hu Ke, Taipei (TW); Chien-Chao Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 113 days.

(21) Appl. No.: 11/809,519

(22) Filed: May 31, 2007

(65) Prior Publication Data
US 2007/0235835 A1    Oct. 11, 2007

Related U.S. Application Data

(62) Division of application No. 11/076,707, filed on Mar. 10, 2005, now Pat. No. 7,238,564.

(51) Int. Cl.
*H01L 29/00*  (2006.01)
(52) U.S. Cl. ........................................ 257/510; 257/513
(58) Field of Classification Search ................ 257/510, 257/513, E21.546
See application file for complete search history.

(56) References Cited

U.S. PATENT DOCUMENTS

| | | | |
|---|---|---|---|
| 5,956,598 A | 9/1999 | Huang et al. |
| 6,001,707 A | 12/1999 | Lin et al. |
| 6,165,871 A | 12/2000 | Lim et al. |
| 6,326,282 B1 | 12/2001 | Park et al. |
| 6,326,283 B1 | 12/2001 | Liang et al. |
| 6,503,802 B2 | 1/2003 | Kim |
| 6,525,403 B2 | 2/2003 | Inaba et al. |
| 6,544,839 B1 | 4/2003 | Kanamitsu et al. |
| 6,613,635 B2 | 9/2003 | Oda et al. |
| 6,746,933 B1 | 6/2004 | Beintner et al. |
| 6,746,936 B1 | 6/2004 | Lee |
| 2002/0064912 A1 | 5/2002 | Komori |
| 2005/0167777 A1 | 8/2005 | Lee |
| 2005/0224907 A1 | 10/2005 | Ko et al. |

OTHER PUBLICATIONS

C. T. Liu et al., "Severe Thickness Variation Of Sub-3nm Gate Oxide Due To Si Surface Faceting, Poly-Si Intrusion, and Corner Stress", Symposium on VLSI Technology Digest Of Technical Papers, pp. 75-76, Jun. 1999.

C. P. Chang et al., Enabling Shallow Trench Isolation For 0.1um Technologies And Beyond, Symposium on VLSI Technology Digest Of Technical Papers, pp. 161-162, Jun. 1999.

(Continued)

*Primary Examiner*—Zandra Smith
*Assistant Examiner*—Pamela E Perkins
(74) *Attorney, Agent, or Firm*—Duane Morris LLP

(57) ABSTRACT

A semiconductor device provides a transistor adjacent an isolation trench. The device may be formed by producing isolation trenches in a semiconductor substrate, filling the trenches with a filler material, creating voids near top edges of the trenches and annealing by a gaseous ambient to reflow the edges of the trenches causing the edges to become rounded and overhang the trench. The filler material may be a dielectric. The transistors which are then formed in close proximity to the trenches may include source/drain regions formed in the rounded portion of the semiconductor substrate that overhangs the trench.

8 Claims, 5 Drawing Sheets

OTHER PUBLICATIONS

Tsutomu Sato et al., "Trench Transformation Technology Using Hydrogen Annealing For Realizing Highly Reliable Device Structure With Thin Dielectric Films", Symposium on VLSI Technology Digest Of Technical Papers, pp. 206-207, Jun. 1998.

S. Matsuda et al., "Novel Corner Rounding Process For Shallow Trench Isolation Utilizing MSTS (Micro-Structure Transformation Of Silicon)", International Electron Devices Meeting 1998, Technical Digest, pp. 137-140, Dec. 1998.

Van Zant, P. Microchip Fabrication Fifth Edition, McGraw-Hill, 2004, p. 611.

SHALLOW TRENCH ISOLATION STRUCTURE FOR SEMICONDUCTOR DEVICE

RELATED APPLICATION

This application is a divisional application of U.S. patent application Ser. No. 11/076,707, filed on Mar. 10, 2005, now U.S. Pat. No. 7,238,564 the contents of which are hereby incorporated by reference as if set forth in their entirety.

BACKGROUND

The present invention relates generally to semiconductor device fabrication, and more particularly to shallow trench isolation (STI) structure fabrication process enhancements.

Isolation structures are used in semiconductor devices to electrically isolate different components of a semiconductor device. These isolation structures between the components reduce adverse noise effects that may cause performance degradation of the semiconductor device. Once the components are isolated from each other, certain electrical paths can be established between the components to obtain the desired electrical characteristics from the semiconductor device.

Conventional methods for fabricating an isolation structure for a semiconductor device typically employ a LOCal Oxidation of Silicon (LOCOS) process. In the LOCOS process, a field oxide layer is thermally grown using an oxidation mask to pattern the growth. However, a portion of the field oxide grows laterally, thereby producing tapering oxide wedge portions outside the desired growth pattern. These oxide wedge portions are referred to as a "bird's beak" due to the shape of the wedge portions. The bird's beak reduces the isolation area between the components of the semiconductor device and can deteriorate the electrical performance of the semiconductor device.

The shallow trench isolation (STI) process is replacing the conventional LOCOS process for the formation of an isolation structure as technology evolves to submicron geometries. The STI process has various advantages over the conventional LOCOS process. For example, the STI process allows for the planarization of the entire substrate and isolation structure. This results in better control of critical dimension (CD) when defining a gate stack of a transistor, for example. Better control of the CD when defining the gate stack results in better control of the CD in further processing steps, which occur after the gate stack is defined.

In a typical STI process, a buffer oxide of 10 to 20 nm is thermally grown on a wafer substrate. A nitride of approximately 200 nm is deposited and then patterned with lithography and etched down to silicon. An etch that is selective to silicon (etches mostly silicon) is then used to etch a trench into the silicon. A liner oxide is thermally grown to anneal out any damage to the silicon and passivate the silicon. Next, an oxide that is considerably thicker than the trench depth is deposited. The wafer is then subjected to a chemical-mechanical polishing that stops when it reaches the nitride. The nitride is then stripped, along with the buffer oxide underneath, thereby forming the STI structure.

For the above-described STI process scheme, the sharp corner where the trench sidewall meets the silicon substrate surface causes many problems with device performance, yield, and reliability. As an example, a parasitic transistor may be inadvertently formed at the corner that has a lower threshold voltage. As another example, a thinner gate oxide may be inadvertently formed at the corner, resulting in immediate device failure or reliability issues.

Other conventional STI process schemes have been devised to overcome the sharp corner effect by thermal oxidation processes, implantation of oxidation-accelerating ions and micro-structure transformation of silicon to round the corner where the trench sidewall meets the silicon substrate. Although these conventional rounding process schemes provide the corner rounding, they have inherent deficiencies. One deficiency of these conventional rounding process schemes is the stress-induced defect generation problem in today's reduced geometry device designs. A second potential deficiency is the damage of the STI sidewalls caused by the HDP oxide filling process of the oxide liner. Another deficiency is the divot-induced reverse narrow channel effect (RNCE) caused by parasitic corner transistors. This undesirable effect is due to the crowding of the electrical field at the STI edge.

Therefore, desirable in the art of semiconductor device fabrication are enhanced processes for shallow trench isolation (STI) structure fabrication that resolve the above deficiencies while increasing device performance, yield, and reliability.

SUMMARY

In view of the foregoing, this invention provides a new STI fabrication process that results in a wider fabrication process window, increases the gate oxide integrity, and increases device performance, yield, and reliability.

In one embodiment of this invention, a new STI fabrication process that forms a STI trench in a semiconductor substrate with a rounded top corner is presented. The rounded top corner includes a portion that overhangs the STI trench and may advantageously be used in the formation of device components such as transistor source/drain regions. The new STI fabrication process also eliminates the divot at the top corner of a trench opening that is typically created by conventional processes, and suppresses the parasitic corner transistor by eliminating the divot created in the conventional processes. In addition, the new STI fabrication process reduces the channel stress which may be induced by the STI corner stress caused by the conventional processes, and reduces the silicide-induced junction problem while improving the narrow device characterization.

The new STI structure created by the new STI fabrication process allows for a wider processing window without surface warping. The gate oxide integrity is improved by eliminating the conventional problems of silicon surface faceting, polysilicon intrusion, and the stress induced thinning at the STI boundaries.

BRIEF DESCRIPTION OF THE DRAWINGS

The construction and method of operation of the invention, together with additional objects and advantages thereof will be best understood from the following description of specific embodiments when read in connection with the accompanying drawings, in which.

DESCRIPTION

Although the invention is illustrated and described herein as embodied in a new STI fabrication process to improve component active region isolation, device yield, and reliability, it is nevertheless not intended to be limited to the details shown, since various modifications and structural changes may be made therein without departing from the spirit of the invention.

Figure 1A:
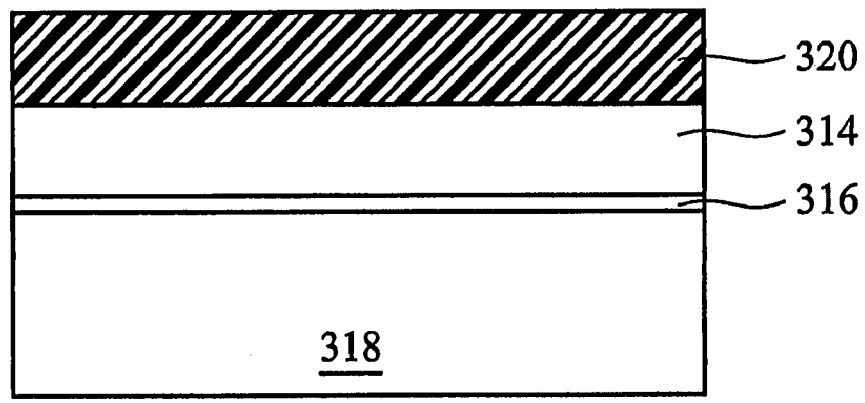
FIGS. 1A-1D present a conventional STI fabrication process.

FIGS. 1A-1D present a conventional STI fabrication process. In FIG. 1A a pad oxide layer 316 is formed on a substrate material 318 which may be silicon, silicon-on-insulator SOI, Ge, C or combinations thereof. This can be accomplished by oxidizing a silicon substrate using a thermal oxidation process, a chemical vapor deposition process, or other existing techniques. A silicon nitride film 314 is then formed on the pad oxide layer 316 using any of various existing conventional techniques. A photoresist layer 320 is then formed on the top surface of the silicon nitride film 314.

Figure 1B:
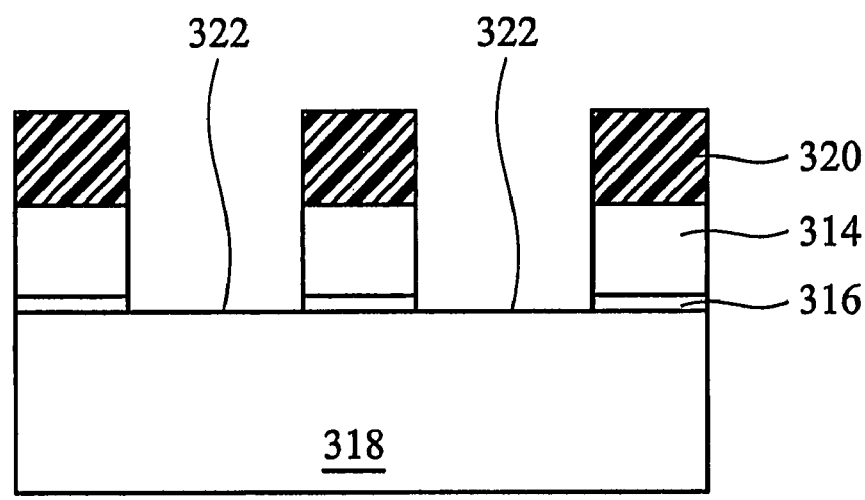

As shown in FIG. 1B, the photoresist layer 320 is patterned using conventional methods and the silicon nitride film 314 and the pad oxide layer 316 are then selectively removed by using the photoresist pattern as a mask using known etching or other removal processes. Portions 322 of the top surface of the substrate material 318, are exposed and correspond to the area where the STI structure will be formed.

Figure 1C:
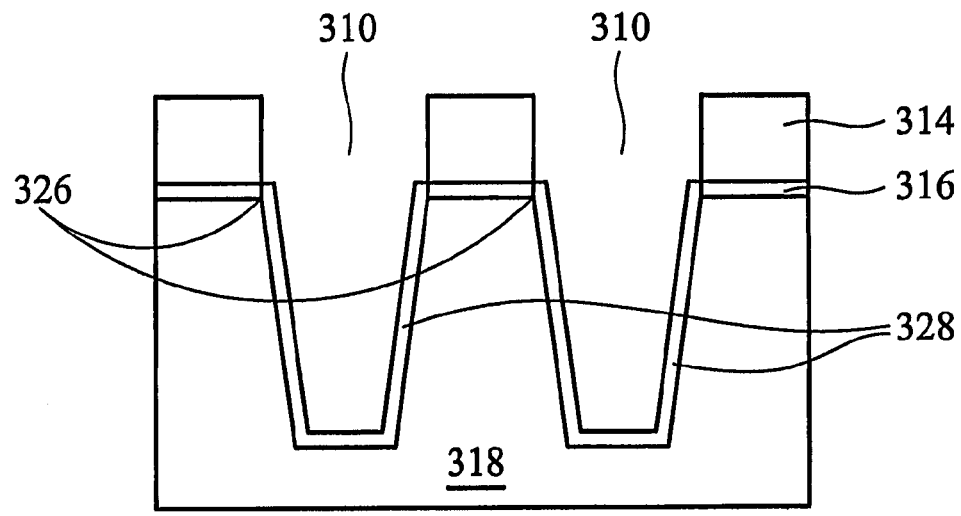

FIG. 1C next shows various trenches 310 formed selectively in the exposed portions 322 (FIG. 1B) of the substrate material 318. The trenches 310 are formed using existing etching techniques that use an etch selective to silicon. The trapezoidal shape of trenches 310 is exemplary only and may alternatively be rectangular. Before the trenches 310 are filled an optional thin oxide film 328 also known as an "oxide liner" may be thermally formed in various trenches 310 and on the exposed surfaces of the pad oxide layer 316. Corner rounding may be achieved during the formation of the thin oxide film 328. During the thermal oxidation process, the corner portions 326 may be rounded automatically as the thin oxide film 328 is formed because the oxidation speed at the various corner portions 326 of the substrate material 318 is much higher than the oxidation speed at other surfaces. The oxidation may take place at a temperature of abut 1000° C.+/−300° C. In other embodiments, oxide film 328 may not be used.

Figure 1D:
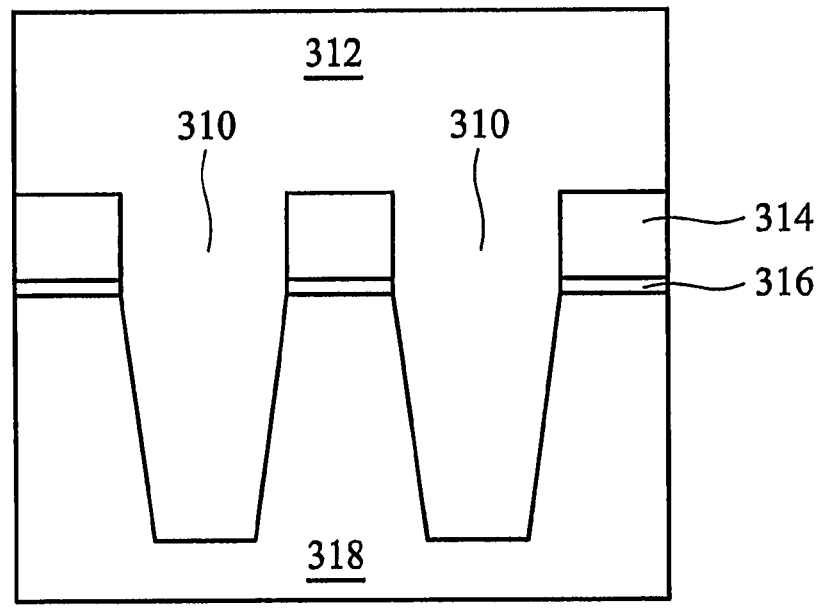
Figure 2A:
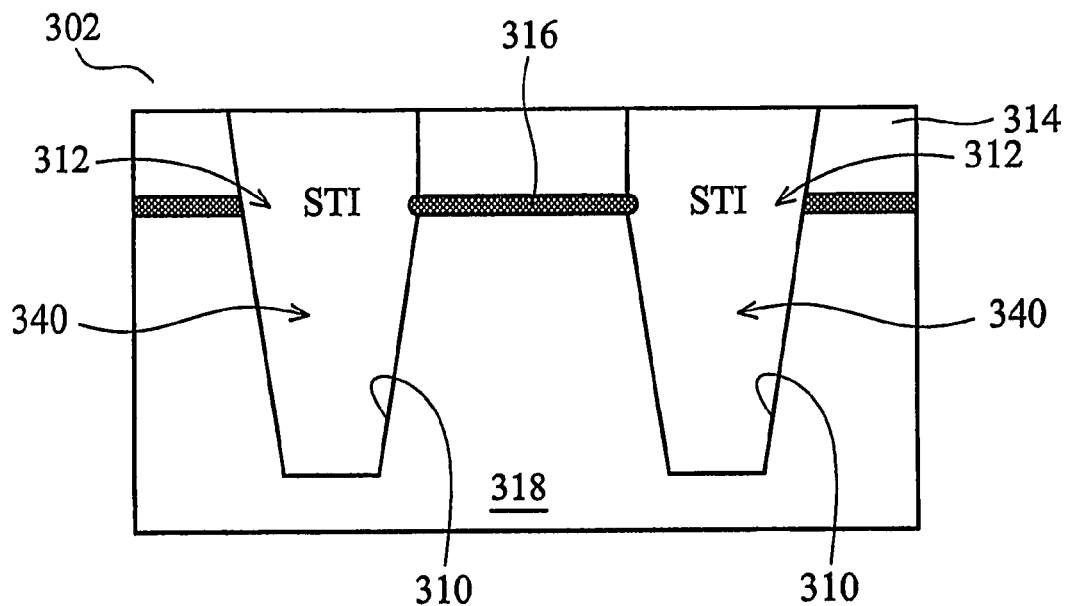
FIGS. 2A-2D present a series of processes in accordance with one embodiment of the present invention.
Figure 2B:
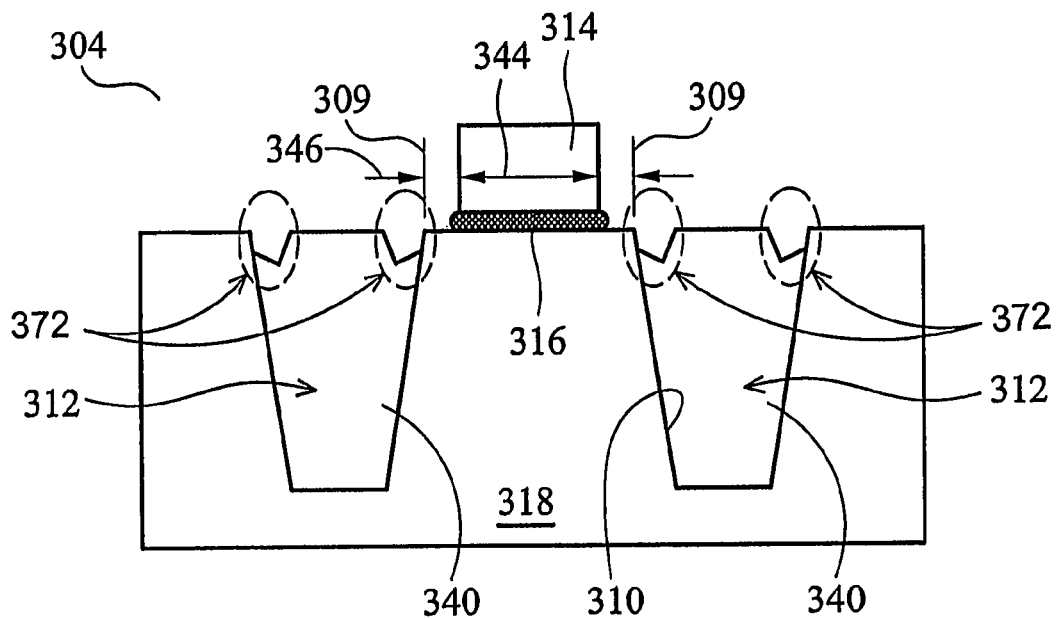
Figure 2C:
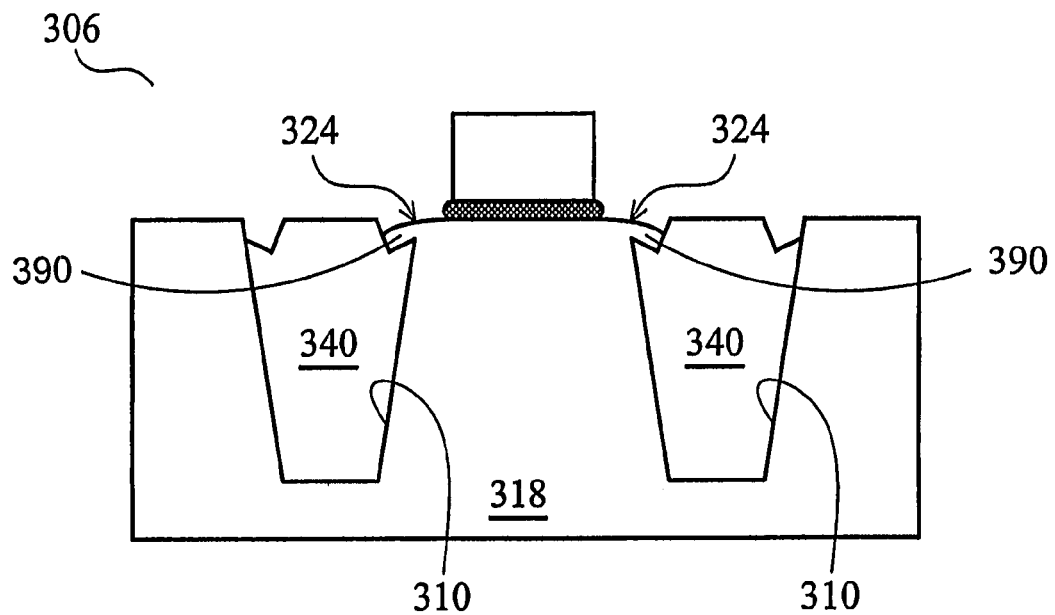
Figure 2D:
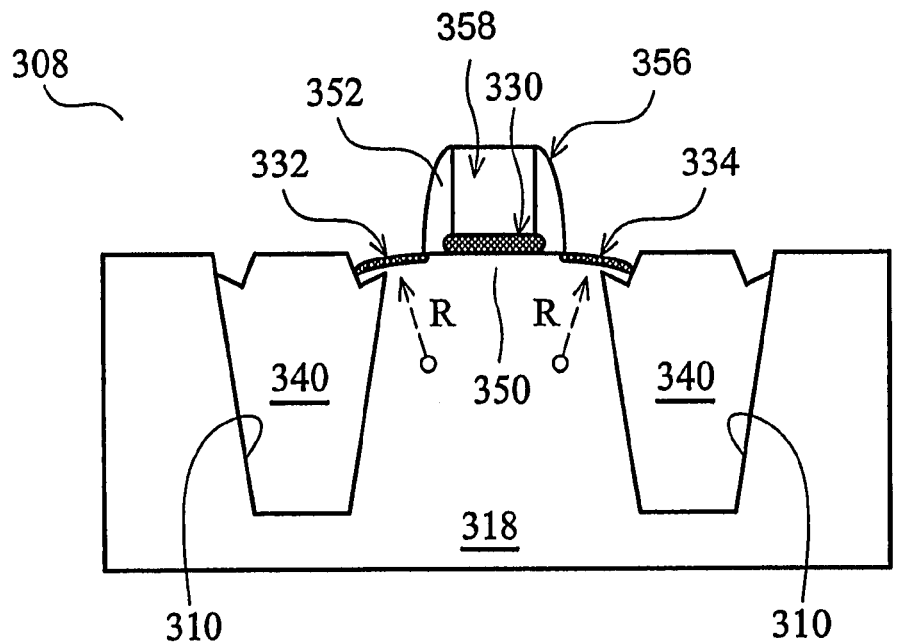
Figure 3:
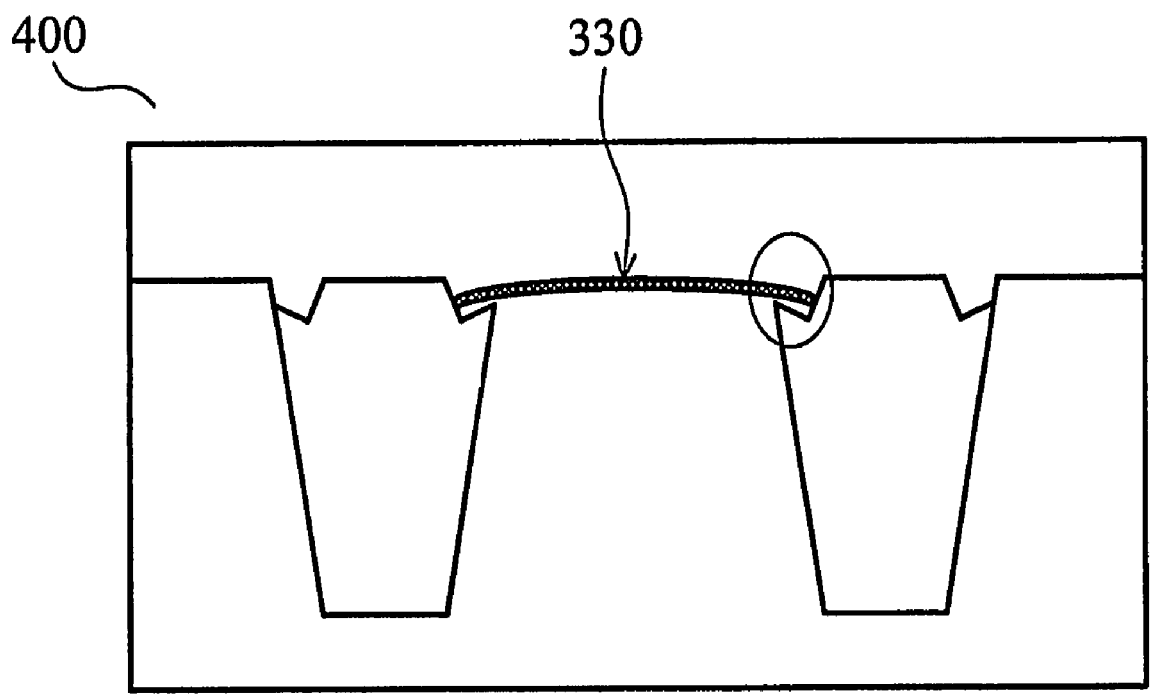
FIG. 3 presents a cross section of the STI corner in accordance with one embodiment of the present invention.

As shown in FIG. 1D, an insulating film 312 is formed in the various trenches 310 and on the exposed surfaces of the silicon nitride film 314 by the chemical vapor deposition (CVD) process. The insulating film is preferably formed as a silicon oxide film and it fills the trenches 310. The structure is then planarized using chemical mechanical polishing (CMP) which removes the insulating film from over the top surface of silicon nitride 314 which serves as a polishing stop film, to form the structure shown in FIG. 2A, which does not include the optional oxide film 328.

In the conventional STI fabrication process, thermal oxidation such as used to form oxide film 328 may be used to form rounded corners because the oxidation speed of the various corner portions 326 of the semiconductor substrate at the entrance of the trench is increased during such thermal oxidation. The increased oxidation speed produces rounded corner portions of the semiconductor substrate near the trench entrance, as above. Rounded corners at the semiconductor substrate are important because they stabilize and improve the electrical characteristics and performance of the semiconductor device by preventing or eliminating concentration of electric fields at the corner portions of the semiconductor substrate at the trench entrance.

There are disadvantages, however, to the conventional STI fabrication process, and other conventional STI fabrication processes not illustrated. The rounding process generates a stress-induced defect generation problem when the device geometry is reduced such as in advanced designs. Also, the STI sidewalls are damaged by the HDP oxide filling process with the oxide liner. Finally, the conventional processes promotes divot induced reverse narrow channel effect (RNCE) due to the creation of the parasitic corner transistors, caused in turn by the crowding of electrical fields at the STI edges.

In contrast, FIGS. 2A-2D and 3 illustrate the improved methods for STI formation according to the present invention. FIGS. 2A-2D present process steps 302, 304, 306 and 308, respectively, in accordance with one embodiment of the present invention. The process steps 302, 304, 306 and 308 are developed to resolve some of the disadvantages of the previously illustrated conventional STI fabrication process, and other similar conventional processes. This novel STI fabrication process of the present invention begins with the structure of FIG. 2A which may be formed according to the sequence shown in FIGS 1A-1D, or by other means that produce STI trench structures formed and filled with an oxide to a level above the pattern mask.

In process step 302, STI filler material 312 is removed by the CMP process, but only down to the top of silicon nitride layer 314. STI filler material 312 may be an oxide, another dielectric or polysilicon. Thus, the silicon nitride layer 314 and silicon oxide layer 316, which may be a pad oxide layer, remain intact on top of the substrate material 318. Silicon nitride layer 314 and silicon oxide layer 316 together form a pattern mask layer. Various STI structures 340 are essentially the trenches 310 filled with STI filler material 312 up to the top of silicon nitride layer 314. The CMP process that produces the structure in process step 302 leaves a planarized surface formed of STI filler material 312 and the top surface of silicon nitride layer 314. It is noteworthy that the pattern mask layer consisting of the silicon nitride layer 314 and a silicon oxide layer 316 covers the full width of the substrate material 318.

In process step 304, an etching process is performed to remove an additional amount of the STI filler material 312 contained in the STI trench structure 340 as well as causing an etch-back of the original sides 309 (shown as dashed lines) of the pattern mask layer. $H_3PO_4$ and HF may be used as the etching solutions for etching the pad nitride and pad oxide, respectively. This etch process essentially removes STI filler material 312 from over the top surface of substrate material 318. Due to this etch-back process, the top corners of the STI trenches have significantly more STI filler material 312 removed at various locations 372, thereby creating voids below the substrate surface and exposing a portion of the upper trench sidewalls as the wet etch preferentially etches along the interface between substrate material 318 and STI filler material 312. In addition, the sides of the pattern mask of the silicon nitride layer 314 and the silicon oxide layer 316 are receded laterally thereby exposing not only a portion of the substrate material 318 at the corners but also the receded sidewalls of the silicon nitride layer 314 and of the silicon oxide layer 316. In other words, width 344 defined by the opposed sidewalls after the etching process, is reduced with respect to previous width 346 defined by original sides 309, before the etching process.

In process step 306, the structure formed after the process step 304 is annealed with a hydrogen gas to reflow and round the corners of the substrate material 318, thereby extending the silicon substrate structure to the trench sidewalls as shown at locations 324. Overhang portions 390 overhangs STI structure 340 by a distance of 10-2000 angstroms. As an example, this annealing process is performed at a pressure of 1 to 1000 Torr and a temperature of 600 to 1100 degrees Celsius, but other annealing conditions may be used in other exemplary embodiments. Hydrogen, nitrogen, helium, argon, xenon, or a combination thereof may be used as the gaseous ambient in the annealing process.

In process step 308, the pattern mask layer consisting of the silicon nitride layer 314 and the silicon oxide layer 316 is removed using conventional methods. A transistor structure 356 is then formed in the device active region between the various STI structures 340 using any of various standard semiconductor fabrication processes. A gate electrode 358 is isolated from the substrate material 318 by a gate dielectric layer 330. The gate dielectric may be comprised of $SiO_2$, $Si_3N_4$, $Si_3O_4$, $Si_3ON$, a high-k dielectric material, or a combination thereof. The gate dielectric layer 330 maybe formed using conventional means such as thermal oxidation or various deposition processes such as chemical vapor deposition (CVD). The gate portion of the exemplary transistor structure 356 is formed on an essentially planar portion of substrate 318. Gate electrode 358 is formed using conventional deposition and patterning methods and may be formed of polysilicon in one embodiment. In other exemplary embodiments, gate electrode 358 may be formed of metal or it maybe a compound structure formed of metal, a semiconductor, metal oxide and/or silicide. Source/drain regions 332, 334 are formed in substrate material 318, including in overhang portions 390, using conventional methods. Source/drain regions 332, 334 may be formed by ion implantation into the substrate and will preferably be self-aligned with respect to the gate structure by using an ion implantation process after the gate the structure has been formed and serves as a mask to protect the underlined channel from being implanted with the source/drain materials. The source/drain regions 332, 334 are formed at opposed ends of channel 350 formed beneath the gate structure and within the substrate. Dielectric spacers 352 may be formed along sidewalls of the gate electrode 358 using conventional methods and may assist in positioning the source/drain regions 332, 334.

It is noteworthy that the rounded corner structures of the source region 332 and the drain region 334 have a radius of curvature R, where R is 5 to 50 nm. A silicide layer 336 may be formed on the source/drain regions 332, 334. Further, the corner extensions to the various STI structures 340 have a length in the range of 1 to 200 nm. Although the semiconductor substrate in this example is comprised of silicon, it is understood by those skilled in the art that the substrate can also consist of a silicon, silicon-on-insulator (SOI), germanium, carbon, or combinations thereof. The channel crystal orientation can also be <100> or <110>.

FIG. 3A presents a cross section 400 of the STI corner in accordance with one embodiment of the present invention. The cross section 400 represents an interim process step between the process step 306 and the process step 308. At this interim step, the gate dielectric layer 330 has been formed, but the remaining portions of the transistor structure 356 (see FIG. 2D) have not yet been created.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor device comprising a transistor formed on a semiconductor substrate and between a duality of opposed isolation trenches formed in the semiconductor substrate, each isolation trench filled with a dielectric, the transistor including a channel region formed within a section of the substrate surface, a gate structure overlying the channel region, and a source region and a drain region formed within the substrate adjacent opposed ends of the channel region and in a corresponding substrate portion that overhangs the corresponding isolation trench such that the drain region overhangs only one isolation trench and the source region overhangs only the other isolation trench, the substrate portion having a completely and continuously curved upper surface, wherein the completely and continuously curved upper surface of the substrate portion is entirely disposed at a height below a top planar surface of the dielectric.

2. The semiconductor device as in claim 1, wherein the substrate portion overhangs the isolation trench by 10-2000 angstroms.

3. The semiconductor device as in claim 1, wherein the completely and continuously curved upper surface of the substrate portion is entirely disposed at a height below a top planar surface of the semiconductor substrate.

4. The semiconductor device as in claim 3, wherein the substrate portion includes a radius of curvature of 5-50 nanometers.

5. The semiconductor device as in claim 1, wherein the source region and the drain region each comprise a silicide formed thereon.

6. The semiconductor device as in claim 1, wherein the a gate structure comprises a gate dielectric material overlying the channel region and a gate electrode overlying the gate dielectric.

7. The semiconductor device as in claim 6, wherein a silicide layer is formed on a surface of the transistor portion.

8. The semiconductor device as in claim 1, wherein the isolation trench extends down from the substrate surface.

* * * * *

UNITED STATES PATENT AND TRADEMARK OFFICE
CERTIFICATE OF CORRECTION

PATENT NO. : 7,745,904 B2
APPLICATION NO. : 11/809519
DATED : June 29, 2010
INVENTOR(S) : Chih-Hsin Ko et al.

It is certified that error appears in the above-identified patent and that said Letters Patent is hereby corrected as shown below:

Claim 6, Column 6, Line 46, after "wherein the" delete "a".

Signed and Sealed this
First Day of February, 2011

David J. Kappos
*Director of the United States Patent and Trademark Office*